United States Patent [19]
Jeong

[11] Patent Number: 5,986,443
[45] Date of Patent: Nov. 16, 1999

[54] LOW POWER REQUIRED INPUT BUFFER

[75] Inventor: Duk-Ju Jeong, Seoul, Rep. of Korea

[73] Assignee: LG Semicon Co., Ltd., Choongcheongbuk do, Rep. of Korea

[21] Appl. No.: 08/891,634

[22] Filed: Jul. 11, 1997

[30] Foreign Application Priority Data

Dec. 30, 1996 [KR] Rep. of Korea ................. 96-77503

[51] Int. Cl.⁶ .................................................. G05F 3/16
[52] U.S. Cl. ......................................... 323/312; 327/391
[58] Field of Search .................................. 323/224, 311, 323/312; 327/108, 333, 198, 391, 432

[56] References Cited

U.S. PATENT DOCUMENTS 5,304,867  4/1994  Morris ........................................ 307/443
5,331,224  7/1994  Ohannes et al. ............................ 307/443
5,442,304  8/1995  Wong et al. ................................ 327/546
5,565,795  10/1996 Kawano ........................................ 326/81

Primary Examiner—Peter S. Wong
Assistant Examiner—Derek J. Jardieu

[57] ABSTRACT

A low power consumption input buffer is disclosed which exhibits reduced power consumption, especially that of a peak current consumed, to make a semiconductor chip (e.g., a memory device) operated in a more stable manner. The buffer employs a switching unit to block a current path so as to decrease current consumption. Noise due to a peak in the current during transmission of an input signal is decreased by using a higher resistance constantly turned-on transistor.

26 Claims, 4 Drawing Sheets

LOW POWER REQUIRED INPUT BUFFER

FIELD OF THE INVENTION

The present invention relates to an input buffer, and more particularly to a low power consumption input buffer, e.g., in a memory device, that decreases the current consumed during voltage transition by lowering a peak current, which makes operation of a semiconductor chip more stable.

BACKGROUND OF THE INVENTION

As shown in FIG. 1, a conventional address input buffer, e.g., of an SRAM or a DRAM, receives a desired memory address location signal AI and, internally to the memory device, transmits an address location signal AO. The conventional input buffer includes: a second PMOS transistor P2 the source of which is connected to an external voltage Vcc and the gate of which is connected to an output of an inverter IN1; a first PMOS transistor P1 the source of which is connected to the drain of the second PMOS transistor P2, the drain of first PMOS transistor being connected to an output terminal OUT and the gate of which is connected to an input terminal IN; a first NMOS transistor N1 the drain of which is connected to the output terminal OUT, the source of which is connected to a ground voltage Vss and the gate of which is connected to the input terminal N1; an inverter IN1 for receiving a chip enable signal CE; and a second NMOS transistor N2 the drain of which is connected to an output terminal OUT, the gate of which is connected to the inverter IN1 and the source of which is connected to the ground voltage Vss.

With reference to FIGS. 1 through 4, the operation of the conventional input buffer will now be described.

When the chip enable signal CE is at a high potential, the output value of the inverter N1 becomes a low potential so that the second PMOS transistor P2 is turned on and the second NMOS transistor N2 is turned off. With the chip enable CE signal high, it is possible for current to flow through the conventional input buffer from the external high potential Vcc to the ground potential Vss depending upon the state of the signal AI. This current is known as Iss.

As shown in FIG. 2, when the input signal AI is at a high potential(and the chip enable signal CE is high), the first PMOS transistor P1 is turned off and the first NMOS transistor N1 is turned on so that an output signal AO becomes a low potential.

To the contrary, when the input signal AI is at a low potential, the first PMOS transistor P1 is turned on and the first NMOS transistor N1 is turned off so that output signal AO becomes a high potential.

When the chip enable signal CE is at a low potential, i.e.) in standby mode, the output value of the inverter N1 remains at a high potential so that the second PMOS transistor P2 is turned off and the second NMOS transistor N2 is turned on. Accordingly, the output signal AO remains at a low potential irrespective of the level of the input signal AI. Also, no current Iss will flow through the conventional input buffer from the external high potential Vcc to the ground potential Vss.

In FIG. 2, during the concurrent transitions of AI and AO from Vss to Vcc and from Vcc to Vss, respectively, there occurs a value of AI, namely the middle voltage or Vm, that will cause both the PMOS P1 and NMOS N1 transistors to turn on. This middle voltage corresponds to the intersection of the AI and AO voltage curves. The value of Vm depends upon the particular characteristics of the transistors involved and their collective configuration. Where Vcc=5 volts and Vss=0 volts, a typical value of Vm is about 1.5 volts. The current Iss peaks at Vm. A similar phenomenon occurs when the signals AI and AO concurrently transition from Vcc to Vss and from Vss to Vcc, respectively. As depicted in FIG. 3, however, the latter type of transitions are of much less consequence than the former transitions, i.e., much more current is consumed when AI goes high and AO goes low.

As shown in FIG. 4, when a middle voltage of about 1.5V is applied as the input signal AI, the first PMOS transistor P1 and the first NMOS transistor N1 are both turned on, resulting in an increased power consumption due to a significant peak in the current waveform Iss.

Again, as shown in FIG. 3, when the input signal AI goes from a low potential to a high potential or vice versa, a peak in the current Iss occurs. These peaks in Iss generate noise because the Vss level is momentarily raised. This noise can cause the chip to malfunction.

SUMMARY OF THE INVENTION

Therefore, it is an object of the present invention to provide a low power consumption input buffer which exhibits reduced power consumption by reducing an amount of operation current that it consumes, and to prevent noise from being generated by decreasing a peak current occurring during transition of an input signal.

To achieve the above-described objects, a low power consumption input buffer for, e.g., a memory device, according to the present invention is provided. The buffer includes: a switching unit for blocking a path from Vcc to Vss of an operation current Iss, according to an input signal; a buffer unit for receiving, inverting and outputting said input signal and outputting an output signal corresponding to said input signal; and an operating unit for receiving a chip enable signal and selectively controlling said output signal regardless of a state of said input signal.

The foregoing and other objectives of the present invention will become more apparent from the detailed description given hereinafter. It should be understood, however, that the detailed description and specific examples, while indicating preferred embodiments, are given by way of illustration only, because various changes and modifications within the spirit and scope of the invention will become apparent to those skilled in the art from this detailed description and specific examples.

BRIEF DESCRIPTION OF THE DRAWINGS

The present invention will become more fully understood from the detailed description given hereinbelow and the accompanying drawings which are given by way of illustration only, and thus do not limit the present invention, and wherein . . .

DETAILED DESCRIPTION OF THE INVENTION

Figure 5:
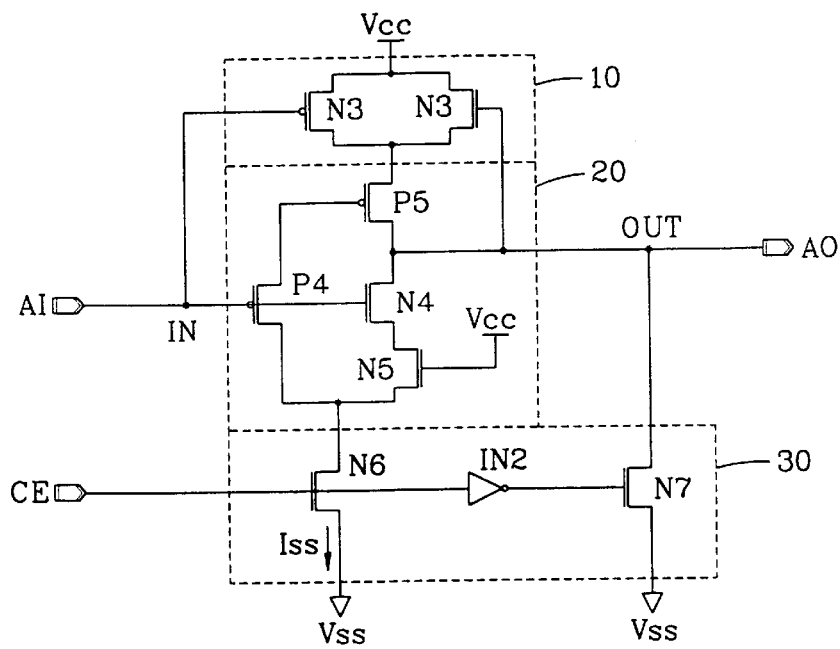
FIG. 5 is a schematic diagram of a low power consumption input buffer according to a first embodiment of the present invention.
Figure 9:
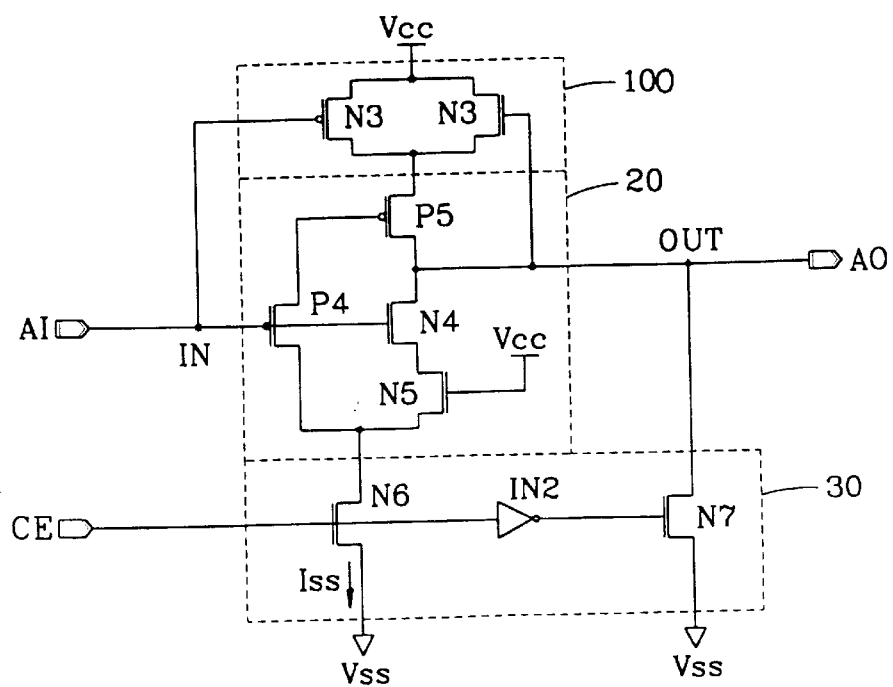
FIG. 9 is a schematic block diagram of a low power consumption input buffer according to a second embodiment of the present invention.

FIGS. 5 and 9 depict exemplary low power consumption input buffers according to the present invention. These buffers, e.g., are for in an SRAM or DRAM. As in the conventional art, such input buffers act as an interface to receive an external memory address location signal and transfer it inside the memory device. In contrast to the prior art, however, the input buffers of FIGS. 5 and 9 exhibit much lower power consumption.

As shown in FIG. 5, a low power consumption input buffer according to a first embodiment of the present invention includes: a switching unit 10 for blocking a path of an operation current Iss; a buffer unit 20 for receiving an input signal AI on an input terminal IN and for outputting an output signal AO inverted from the input signal AI; and an operating unit 30 for receiving a chip enable signal CE and for controlling an output from the buffer unit 20.

The switching unit 10 includes: a PMOS transistor P3 the gate of which is connected to the input terminal IN, the drain of which is connected to an external voltage Vcc and the source of which is connected to the buffer unit 20; and an optional NMOS transistor N3 the gate of which is connected to an output terminal OUT, the source of which is connected to the external voltage Vcc and the drain of which is connected to the buffer unit 20. Though optional, it is preferred that the NMOS transistor N3 be included.

The buffer unit 20 includes: a PMOS transistor P5 the drain of which is connected to the switching unit 10 and the source of which is connected to the output terminal OUT; a PMOS transistor P4 the gate of which is connected to the input terminal IN, the drain of which is connected to the gate of the PMOS transistor P5 and the source of which is connected to the operating unit 30; an NMOS transistor N4 the gate of which is connected to the input terminal IN and the source of which is connected to the output terminal OUT; and an NMOS transistor N5 the gate of which is connected to the external voltage Vcc, the source of which is connected to the NMOS transistor N4 and the drain of which is connected to the operating unit 30.

The operating unit 30 includes: an NMOS transistor N6 the gate of which is connected to the chip enable signal CE, the drain of which is connected to the buffer unit 20 and the source of which is connected to a ground voltage Vss; an inverter IN2 for receiving the chip enable signal CE; and an NMOS transistor N7 the gate of which is connected to the inverter IN2, the drain of which is connected to the output terminal OUT and the source of which is connected to the ground voltage Vss.

The operation of the low power consumption input buffer of FIG. 5 will now be described with reference to FIGS. 5 through 8.

First, when the chip enable signal CE is at a high potential, the NMOS transistor N6 is turned on and the NMOS transistor N7 is turned off. At this time, the NMOS transistor N5 is kept turned on.

Figure 6:
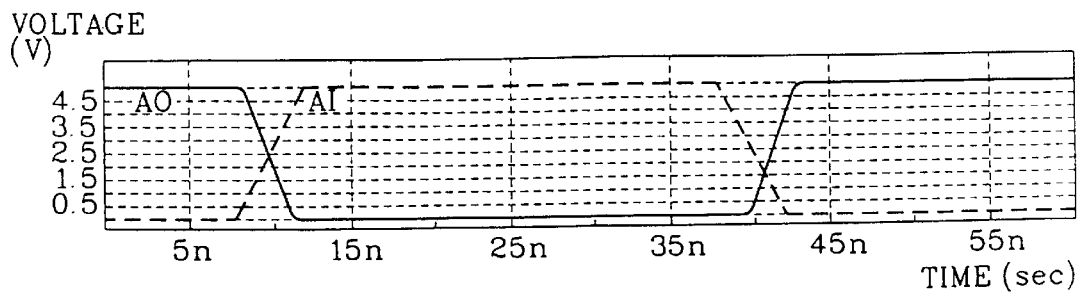
FIG. 6 is a graph illustrating the relation between an input signal AI and an output signal AO, with regard to time, that is exhibited by the buffer of FIG. 5.

As shown in FIG. 6, when the input signal AI is at a high potential, the PMOS transistor P4 is turned off and the NMOS transistor N4 is turned on so that the output signal AO becomes a low potential.

To the contrary, when the input signal AI is at a low potential, the PMOS transistors P3, P4 and P5 are turned on and the NMOS transistor N4 is turned off so that the output signal AO becomes a high potential.

Also, when the chip enable signal CE is at a low potential, the NMOS transistor N6 is turned off and the NMOS transistor N7 is turned on so that output signal AO always remains at a low potential without regard to a level of the input signal AI.

Figure 2:
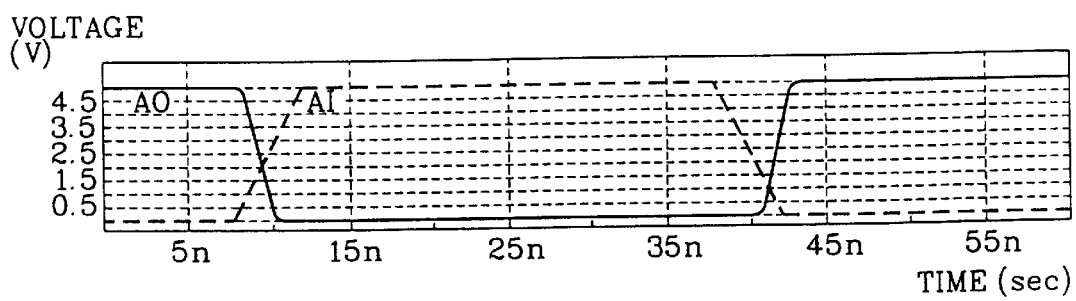
FIG. 2 is a graph illustrating a relation between an input signal AI and an output signal AO with regard to time that is characteristic of the conventional buffer of FIG. 1.
Figure 3:
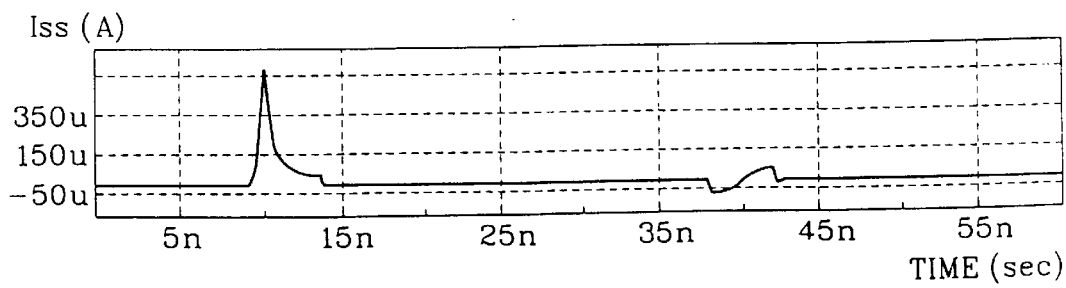
FIG. 3 is a graph illustrating variation, of a peak operation current Iss with regard time, that is characteristic of the conventional buffer of FIG. 1.
Figure 4:
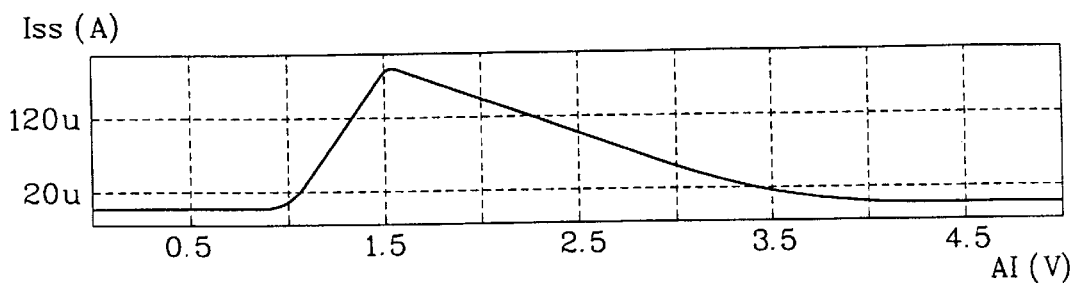
FIG. 4 is a graph illustrating variation, of the operation current Iss with regard to the input signal AI, that is characteristic of the conventional buffer of FIG. 1.
Figure 7:
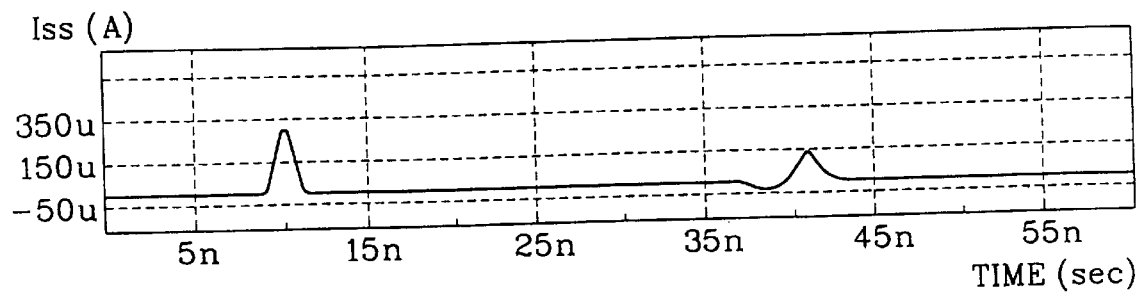
FIG. 7 is a graph illustrating variation of a peak operation current Iss, with regard to time, that is exhibited by the buffer of FIG. 5.
Figure 8:
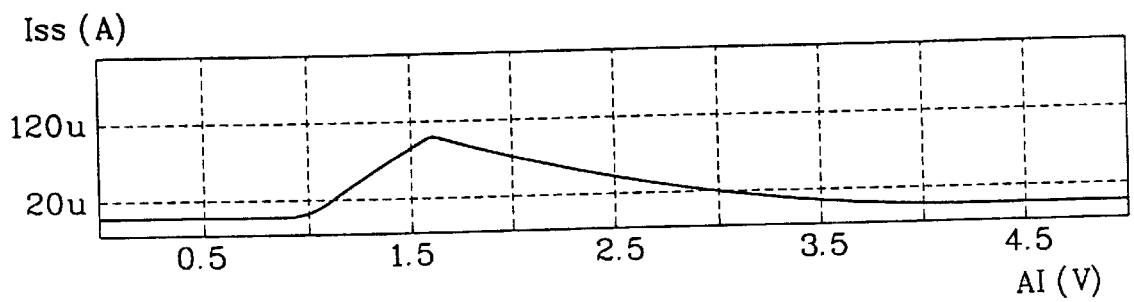
FIG. 8 is a graph illustrating variation of an operation current compared to an input signal that is exhibited by the buffer of FIG. 5.

FIG. 6 depicts exemplary AI and AO curves exhibited by the input buffer of FIG. 5. Due to circuitry differences between FIG. 5 and FIG. 1, the voltage Vm of FIG. 6 is higher than the conventional Vm of FIG. 2. The length of time between when AI reaches Vm and when AI reaches Vcc corresponds to the magnitude of Iss. Because Vm of FIG. 6 is greater than the conventional Vm of FIG. 2, the time it takes to go from Vm to Vcc in FIG. 6 is less than it takes in conventional FIG. 2. Thus, the corresponding magnitude of Iss in FIG. 7 is smaller than the conventional magnitude Iss in FIG. 3. Similarly, the plot of Iss as a function of AI in FIG. 8 has a lower peak value of Iss than the conventional FIG. 4.

The significance of the circuitry differences between FIG. 5 and the conventional FIG. 1 will be explained. The path between Vcc and Vss in FIG. 1 includes three transistors. In contrast, the path between Vcc and Vss in FIG. 5 includes five transistors. Each transistor has a resistance. Assuming that the conventional transistors have resistances comparable to the transistors of the present invention, five transistors represent a larger path resistance than three, i.e., greater by a factor of about 1.66.

The transistors P3/N3, P5, N4 and N6 of FIG. 5 have resistances comparable to the conventional transistors. The NMOS transistor N5, however, has a significantly higher resistance. Transistor resistance is determined in part according to the dimensions of the channel therein. A long and narrow channel will contribute to a significantly higher transistor resistance than a short and wide channel. The channel of NMOS transistor N5, e.g., is narrower and longer than the channels of the other transistors, so it has a higher resistance. The higher resistance of the NMOS transistor N5 is for the purpose of decreasing the peak magnitude of the current Iss, i.e., it acts as an active resistor that limits peak current therethrough.

Figure 1:
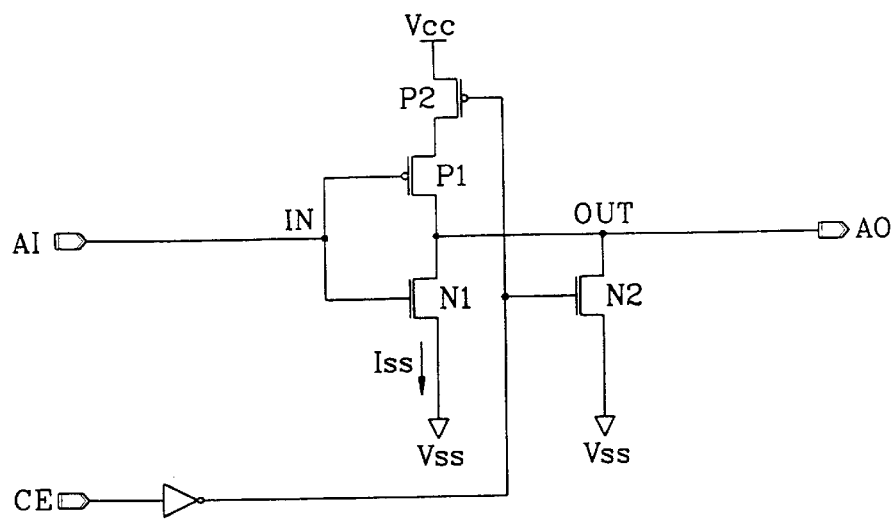
FIG. 1 is a schematic block diagram of a conventional input buffer.

In the conventional input buffer of FIG. 1, the Iss path goes through two transistors whose gates are connected in parallel to AI. The magnitude of AI for the conventional input buffer of FIG. 1 need only rise to the threshold voltage Vt of one transistor in order for a path from Vcc to Vss to be created, i.e., AI need only be equal to the transistor threshold voltages on the path to which the signal AI is sequentially connected. Because the AI signal of conventional FIG. 1 is connected in parallel to two gates, its magnitude need only rise to one multiple of Vt.

In contrast, the Iss path of FIG. 5 goes through 5 transistors, of which 3 have their gates connected sequentially to the signal AI. Thus, for the input buffer of FIG. 5, the signal AI must rise to a signal equal to 3Vt before the path Iss is established. This contributes to Vm in FIG. 6 being greater than the conventional Vm of FIG. 2, thus helping to make the time it takes for the voltage to go from Vm to Vcc in FIG. 6 be less than the comparable time of conventional FIG. 2, and thus making the magnitude of Iss in FIG. 7 smaller than the conventional magnitude Iss in FIG. 3.

It is noted that the input buffer circuit embodiments of exemplary FIG. 5 (discussed above) and exemplary FIG. 9 (to be discussed below) have been depicted in CMOS having a certain arrangement of PMOS and NMOS gates. As an alternative, the converse of NMOS and PMOS gates could be used, and such a conversion is within the ordinary level of skill in the art. Similarly, logic other than CMOS could be used.

As shown in FIG. 9, a low voltage required input buffer according to a second embodiment of the present invention is identical to that of FIG. 5 (depicting a first embodiment of the present invention), except for the structure of the switching unit 100. The switching unit 100 includes: a PMOS transistor P6 the gate of which is connected to an output of inverter IN2 the operating unit 30, and the source of which is connected to the external voltage Vcc. Also in FIG. 9, the gate of the PMOS transistor P3 the gate is connected to the input terminal IN, and the drain thereof is connected to the drain of the PMOS transistor P6. The source of the transistor P3 being connected to the buffer unit 20. The gate of the NMOS transistor N3 is connected to the output terminal OUT, and the source thereof is connected to the drain of the PMOS transistor P6. The drain of the transistor N3 is connected to the buffer unit 20. Again, the NMOS transistor N3 is optional, though it is preferred that it be included.

Referring to FIGS. 9 through 12, the operation of the low power consumption input buffer of FIG. 9 will now be described.

First, when the chip enable signal CE is at a high potential, the NMOS transistor N6 is turned on, the NMOS transistor N7 is turned off and the PMOS transistor P6 is turned on.

Figure 10:
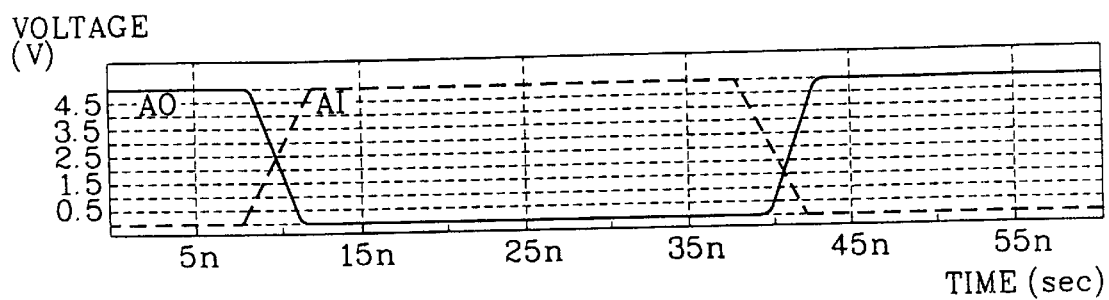
FIG. 10 is a graph illustrating a relation between an input signal AI and an output signal AO, with regard to time, that is exhibited by the buffer of FIG. 9.
Figure 11:
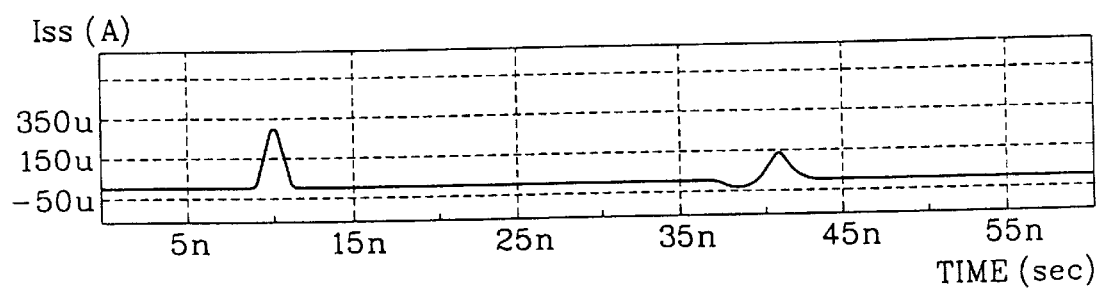
FIG. 11 is a graph illustrating variation, of a peak operation current Iss with regard to an input signal AI, that is exhibited by the buffer of FIG. 9.
Figure 12:
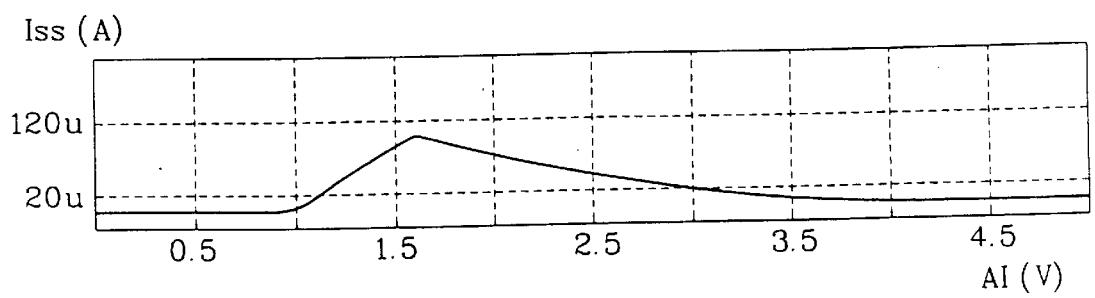
FIG. 12 is a graph illustrating variation, of an operation current Iss compared to an input signal AI, that is exhibited by the buffer of FIG. 9.

FIG. 10 depicts exemplary AI and AO curves exhibited by the input buffer of FIG. 9. Due to circuitry differences between FIG. 9 and FIG. 1, the voltage Vm of FIG. 6 is higher than the conventional Vm of FIG. 2. The length of time between when AI reaches Vm and when AI reaches Vcc corresponds to the magnitude of Iss. Because Vm of FIG. 10 is greater than the conventional Vm of FIG. 2, the time it takes to go from Vm to Vcc in FIG. 10 is less than it takes in conventional FIG. 2. Thus, the corresponding magnitude of Iss in FIG. 11 is smaller than the conventional magnitude Iss in FIG. 3. Similarly, the plot of Iss as a function of AI in FIG. 12 has a lower peak value of Iss than the first embodiment of the invention depicted in FIG. 4.

The significance of the circuitry differences between FIG. 9 and the conventional FIG. 1 will be explained. The differences between FIG. 5 and the conventional FIG. 1 have been discussed above. FIG. 9 differs from FIG. 5 only in the additional PMOS transistor P6 included in FIG. 9, thus only the significance of the PMOS transistor P6 will be discussed below. This difference between FIG. 9 and FIG. 5 contributes to the Iss current consumption of the input buffer of FIG. 9 being slightly smaller than the input buffer current of FIG. 5. Though optional, it is preferred that the input buffer of the present invention have the PMOS transistor P6.

During a standby mode (when CE is at a low potential), while the input signal AI rises to a high potential, it passes through a middle voltage state during which current can run through the PMOS transistor P3 and the PMOS transistor N5 and to Vss through the NMOS transistor N7. The PMOS transistor P6 serves as a switch to the stop this flow, albeit small, of current.

As shown in FIG. 10, when the input signal AI is at a high potential, the PMOS transistor P4 is turned off and the NMOS transistor N4 is turned on so that the output signal AO becomes a low potential.

To the contrary, in FIG. 9, when the input signal AI is at a low potential, the PMOS transistor P4 is turned on (which brings the gate of the transistor P5 to a low potential thereby turning it on) and the NMOS transistor N4 is turned off so that the ground Vss is not applied to the output AO. To recall, the low potential on the gate of the transistor P6 (due to the low potential value of the chip enable signal CE being inverted by the inverter IN2) causes P6 to turn on, thereby transferring the external voltage Vcc to the source of the transistor P3. The voltage Vcc on the source of the turned-on transistor P3 is transferred to the source of the turned-on transistor P5. The transistor P5 raises the voltage on its drain, i.e., AO, to the high potential Vcc.

When the chip enable signal CE is at a low potential, the NMOS transistor N7 is turned on (because of the intervening inverter IN2), so that output signal AO is kept at a low potential without regard to input signal AI. Also, the NMOS transistor N6 is turned off, and the PMOS transistor P6 is turned off (due to the intervening inverter IN2).

Therefore, when the output signal AO is turned to a low potential (because the NMOS transistor N7 is turned on), the NMOS transistor N3 is turned off, and when the input signal AI remains at a high potential (so that the PMOS transistor P3 is turned off), a current path from an external voltage Vcc to the ground voltage Vss is blocked. This reduces current consumption.

When the output signal AO is at a high potential, the NMOS transistor N3 becomes turned on and (because input signal AI is at a low potential), the PMOS transistor P3 becomes turned on. Also, since the input signal AI is at a low potential, the NMOS transistor N4 becomes turned off.

Again, the NMOS transistor N5 of FIG. 9 has a ratio of channel length to width which results in an increased resistance, thereby contributing to a decreased current consumption.

As described above and as shown in FIGS. 5 through 12, the low power consumption input buffer according to the present invention enables the operation current Iss to be significantly decreased compared to that of a conventional art, because of the current-path-blocking abilities exhibited by the switching unit 10 and because of the increased resistance exhibited by the NMOS transistor N5 (which especially helps reduce the peak in Iss). This decreases noise and stabilizes the operation of the input buffer.

The invention being thus described, it will be obvious that the same many be varied in may ways. Such variations are not to be regarded as a departure from the spirit and scope of the invention, and all such modifications as would be obvious to one skilled in the art are intended to be included within the scope of the following claims.

What is claimed is:

1. A low power consumption input buffer comprising:
   a switching unit for blocking a path from Vcc to Vss of an operation current Iss, according to an input signal;
   a buffer unit for receiving, inverting and outputting said input signal and outputting an output signal corresponding to said input signal; and
   an operating unit for receiving a chip enable signal and selectively controlling said output signal regardless of a state of said input signal.

2. The buffer of claim 1, wherein the operating unit comprises:
   a first NMOS transistor receiving a chip enable signal and connected between said buffer unit and a ground voltage; and
   an inverter receiving said chip enable signal; and
   a second NMOS transistor receiving an output value of said inverter and connected between an output signal terminal and said ground voltage.

3. The buffer as in claim 1, wherein said buffer includes a plurality of transistors each of which forms a part of said path of said operation current Iss, one of said transistors being of a relatively and significantly higher resistance than the other transistors so as to limit a peak value of said operation current Iss.

4. The buffer of claim 1, wherein said switching unit comprises a first PMOS transistor and a first NMOS transistor which are connected in parallel such that the drains thereof are connected together and the sources thereof are connected together.

5. The buffer of claim 4, wherein said first PMOS transistor carries out an on/off operation in accordance with said input signal and said first NMOS transistor carries out an on/off operation in accordance with said output signal.

6. The buffer of claim 1, wherein said switching unit includes a pair of transistors connected in parallel and operable in phase.

7. The buffer of claim 6, wherein said pair of switching transistors includes a transistor of a first conductivity type and a transistor of a second conductivity type opposite to said first conductivity type.

8. The buffer of claim 6, wherein a first transistor of said pair is controlled by said input signal and a second transistor of said pair is controlled by said output signal.

9. The buffer of claim 1, wherein said buffer unit comprises:
   a first PMOS transistor the gate of which is connected to said input signal; and
   a second PMOS transistor and a first NMOS transistor which are serially connected to each other between an output terminal in said switching unit and said operating unit.

10. The buffer of claim 9, wherein the drain of said first PMOS transistor is connected to a gate of said second PMOS transistor and the source of said third PMOS transistor is connected to said switching unit and respective sources of said first PMOS transistor and said first NMOS transistor are commonly connected to said operating unit.

11. The buffer of claim 9, wherein said output signal is applied to the source of said second PMOS transistor and to the drain of said first NMOS transistor.

12. The buffer of claim 9, further comprising a second NMOS transistor, connected to said first NMOS transistor, of higher resistance than the other transistors, said second NMOS transistor also being connected to another input of said operating unit.

13. The buffer of claim 12, wherein an external voltage is applied as said another input to the gate of said second NMOS transistor to obtain constantly-on operation.

14. A low power consumption input buffer, comprising:
   a switching unit for blocking a path from Vcc to Vss of an operation current Iss according to an input signal;
   a buffer unit for receiving, inverting and outputting said input signal and outputting an output signal corresponding to said input signal;
   an operating unit for receiving a chip enable signal and selectively controlling said output signal regardless of a state of said input signal; and
   a first transistor connected between an external voltage and said switching unit, for supplementally blocking said path of said operation current Iss according to said chip enable signal.

15. The buffer of claim 14, wherein said first transistor is a PMOS transistor and said operating unit comprises:
   a first NMOS transistor for receiving a chip enable signal and connected between said buffer unit and a ground voltage;
   an inverter for receiving said chip enable signal the output of which is connected to the gate of said first PMOS transistor; and
   a second NMOS transistor for receiving said output of said inverter and connected between an output signal terminal and a ground voltage.

16. The buffer of claim 14, wherein said operating unit includes a current blocking transistor connected between said buffer unit and $V_{SS}$, said transistor being controlled by said chip enable signal.

17. The buffer of claim 14, wherein said first transistor is a PMOS transistor and said switching unit comprises a second PMOS transistor and a first NMOS transistor which are connected in parallel such that the drains thereof are connected together and the sources thereof are connected together.

18. The buffer of claim 17, wherein said second PMOS transistor carries out an on/off operation in accordance with said input signal and said first NMOS transistor carries out an on/off operation in accordance with said output signal.

19. The buffer of claim 14, wherein said switching unit includes a pair of transistors connected in parallel and operable in phase.

20. The buffer of claim 19, wherein said pair of switching transistors includes a transistor of a first conductivity type and a transistor of a second conductivity type opposite to said first conductivity type.

21. The buffer of claim 19, wherein a first transistor of said pair is controlled by said input signal and a second transistor of said pair is controlled by said output signal.

22. The buffer of claim 14, wherein said first transistor is a PMOS transistor and said buffer unit comprises:
   a second PMOS transistor receiving said input signal; and
   a third PMOS transistor and a first NMOS transistor which are serially connected to each other between an output terminal in said switching unit and said operating unit.

23. The buffer of claim 22, wherein a drain of said second PMOS transistor is connected to a gate of said third PMOS transistor, said second PMOS transistor receives said input signal, and respective sources of said second PMOS transistor and said first NMOS transistor are commonly connected to said operating unit.

24. The buffer of claim 22, wherein said output signal is applied to a source of said third PMOS transistor and to a gate of said first NMOS transistor.

25. The buffer of claim 22, wherein said buffer unit further comprises:
- a second NMOS transistor the resistance of which is substantially greater than the other transistors;
- wherein said third PMOS and said second NMOS transistor are serially connected to each other and said first and second NMOS transistors are serially connected to each other between said output terminal of said switching unit and said operating unit.

26. The buffer of claim 25, wherein an external voltage is applied to the gate of said second NMOS transistor to obtain a constant on-operation.

* * * * *